(12) United States Patent
Zheng et al.

(10) Patent No.: US 6,912,163 B2
(45) Date of Patent: Jun. 28, 2005

(54) MEMORY DEVICE HAVING HIGH WORK FUNCTION GATE AND METHOD OF ERASING SAME

(75) Inventors: Wei Zheng, Santa Clara, CA (US); Yun Wu, Sunnyvale, CA (US); Hidehiko Shiraiwa, San Jose, CA (US); Mark T. Ramsbey, Sunnyvale, CA (US); Tazrien Kamal, San Jose, CA (US)

(73) Assignee: FASL, LLC, Sunnyvale, CA (US)

( * ) Notice: Subject to any disclaimer, the term of this patent is extended or adjusted under 35 U.S.C. 154(b) by 22 days.

(21) Appl. No.: 10/658,506

(22) Filed: Sep. 9, 2003

(65) Prior Publication Data

US 2004/0136240 A1 Jul. 15, 2004

Related U.S. Application Data

(63) Continuation-in-part of application No. 10/341,881, filed on Jan. 14, 2003.

(51) Int. Cl.[7] .............................................. G11C 16/04
(52) U.S. Cl. ............................. 365/185.29; 365/185.18
(58) Field of Search ...................... 365/185.29, 185.18, 365/185.27, 185.3, 185.33

(56) References Cited

U.S. PATENT DOCUMENTS

| | | | |
|---|---|---|---|
| 5,311,049 A | | 5/1994 | Tsuruta |
| 5,612,547 A | | 3/1997 | Clarke et al. |
| 5,768,192 A | * | 6/1998 | Eitan .................... 365/185.24 |
| 5,888,867 A | | 3/1999 | Wang et al. |
| 5,898,197 A | | 4/1999 | Fujiwara |
| 6,011,725 A | * | 1/2000 | Eitan .................... 365/185.33 |
| 6,122,201 A | * | 9/2000 | Lee et al. ............. 365/185.29 |
| 6,137,718 A | | 10/2000 | Reisinger |
| 6,215,702 B1 | | 4/2001 | Derhacobian et al. |
| 6,246,606 B1 | * | 6/2001 | Forbes et al. .......... 365/185.03 |
| 6,265,268 B1 | | 7/2001 | Halliyal et al. |
| 6,348,420 B1 | | 2/2002 | Raaijmakers et al. |
| 6,456,533 B1 | | 9/2002 | Hamilton et al. |
| 6,754,105 B1 | * | 6/2004 | Chang et al. .......... 365/185.18 |
| 2001/0044187 A1 | | 11/2001 | Joo et al. |
| 2002/0141237 A1 | | 10/2002 | Goda et al. |
| 2003/0080370 A1 | | 5/2003 | Harari et al. |

FOREIGN PATENT DOCUMENTS

WO   WO 98/06138   2/1998

OTHER PUBLICATIONS

Reisinger, H. et al., "A Novel SONOS Structure for Non-volatile Memories with Improved Data Retention," 1997 Symposium on VLSI Technology Digest of Technical Papers, Jun. 10, 1997, pp. 113–114.

Reisinger H. et al., "A Novel Sonos Structure for Nonvolatile Memories with Improved Data Retention", 1997 Symposium on VLSI Technology Digest of Technical Papers, Jun. 10, 1997, pp. 113–114.

* cited by examiner

*Primary Examiner*—Anh Phung
(74) *Attorney, Agent, or Firm*—Renner, Otto, Boisselle & Sklar, LLP

(57) ABSTRACT

A charge trapping dielectric memory device. The memory device includes a gate electrode disposed over a dielectric stack that includes a dielectric charge trapping layer. The gate electrode has a work function of about 4.6 eV to about 5.2 eV.

29 Claims, 7 Drawing Sheets

MEMORY DEVICE HAVING HIGH WORK FUNCTION GATE AND METHOD OF ERASING SAME

RELATED APPLICATION DATA

This application is a continuation-in-part of U.S. patent application Ser. No. 10/341,881, filed Jan. 14, 2003, and titled "Memory Device Having a P+ Gate and Thin Bottom Oxide and Method of Erasing Same," the disclosure of which is herein incorporated by reference in its entirety.

TECHNICAL FIELD

The present invention relates generally to the field of non-volatile memory devices and, more particularly, to a charge trapping dielectric memory device with a gate electrode having a work function selected to enhance data retention.

BACKGROUND

A pervasive trend in modern integrated circuit manufacture is to increase the amount of data stored per unit area on an integrated circuit memory unit, such as a flash memory unit. Memory units often include a relatively large number of core memory devices (sometimes referred to as core memory cells). For instance, a conventional dual cell memory device, such as a charge trapping dielectric flash memory device, can store data in a "double-bit" arrangement. That is, one bit can be stored using a first charge storing region on a first "side" of the memory device (or normal bit) and a second bit can be stored using a second charge storing region on a second "side" of the memory device (or complimentary bit).

In a conventional charge trapping dielectric flash memory device, the charge storing regions are part of a non-conductive charge trapping layer that is disposed between a bottom (or tunnel) dielectric layer and a top dielectric layer. This dielectric stack can be formed over a P type silicon substrate having a first and a second bit line disposed therein. A conductive word line made from N type or N+ type polycrystalline silicon (also referred to as poly-silicon or poly-Si) is formed over the dielectric stack and serves as a gate electrode. The bit lines can be formed from N+ conductivity type material and, upon application of appropriate voltages to the word line and/or the bit lines, the bit lines can respectively function as a source and a drain with an active channel region defined therebetween.

By the appropriate application of voltage potentials to the gate electrode, the source and/or the drain, each charge storing region can be programmed to store an amount of charge corresponding to a programmed, or charged, data state (as opposed to an unprogrammed, or blank, data state). Programming of the charge storage regions involves channel hot electron (CHE) injection where electrons traveling within the channel and that have a sufficient amount of energy to overcome the barrier height of the tunnel dielectric layer, can become injected into the charge trapping layer where they become trapped.

A conventional charge trapping dielectric memory device, (e.g., having an N+ polysilicon gate electrode) can only be erased using the conventional technique of "hot hole injection" (sometimes referred to as band-to-band (BTB) hot hole injection). In hot hole injection, a gate voltage of approximately −4 to −8 volts is applied along with a drain voltage on the order of 4.5 to 6.0 volts, while the source is floated or grounded to erase one of the memory cells (typically the normal bit). Conversely, the complementary bit cell is erased by floating the drain and applying the appropriate voltages to the source and the gate.

With such erase conditions, a BTB tunnel current is created under the gate. Holes are generated under these conditions and accelerate from the N-type drain region into the P-type body. The generated holes are accelerated in the electrical field created near the P-N drain/body junction. Some of the accelerated holes surmount the oxide to silicon interface between the substrate and the bottom oxide and are injected into the nitride charge storing layer to displace electrons (e.g., by recombination) and erase the cell.

However, as the hot holes bombard the interface between the substrate and the bottom tunnel oxide, the interface and the bottom tunnel oxide can become damaged. This damage leads to data retention problems. For instance, degraded data retention reliability over program/erase cycling can occur due to stored charge leakage through the damaged tunnel oxide. As a result, a charge amount that has been "programmed" into one or both of the charge trapping regions can be reduced over time. In certain circumstances, enough charge can be lost that the data retention capability of the memory device is compromised.

Another erase mechanism used in floating gate devices (e.g., charge is stored in a conductive polysilicon layer rather than a dielectric layer), is channel erase (also commonly referred to as a Fowler-Nordheim (FN) erase). However, FN erase is problematic for conventional charge trapping dielectric memory devices. More specifically, the vertical electric fields present during the erase not only cause electrons to be pushed out from the charge storing layer to the substrate, but also cause electrons to flow from the N+ gate through the top oxide and into the charge storing layer at approximately the same tunneling rate. Therefore, while there is a net current from the gate electrode to the substrate, charge is not erased effectively from the charge storing layer.

In view of the foregoing, there is a need in the art for improved dielectric charge trapping memory devices that can retain trapped charge amounts over a longer period of time.

SUMMARY OF THE INVENTION

According to one aspect of the invention, the invention is directed to a charge trapping dielectric memory device. The memory device can include a substrate having a first conductive region and a second conductive region formed therein and a channel region interposed between the first and the second conductive regions; a first dielectric layer disposed over the substrate; a dielectric charge trapping layer disposed over the first dielectric layer; a second dielectric layer disposed over the charge trapping layer; and a gate electrode disposed over the second dielectric layer, wherein the gate electrode has a work function of about 4.6 eV to about 5.2 eV.

According to another aspect of the invention, the invention is directed to a method of performing an erase operation on a non-volatile, charge trapping dielectric memory device having a source and a drain within a substrate, a first dielectric layer disposed over the substrate, a dielectric charge trapping layer disposed over the first dielectric layer, a second dielectric layer disposed over the charge trapping layer, and a gate electrode disposed over the second dielectric layer to define a channel between the source and the drain, the memory device having been programmed by trapping charge in at least one charge trapping region of the dielectric charge trapping layer. The method can include simultaneously applying a negative erase voltage to a gate electrode, the gate electrode having a work function of about 4.6 eV to about 5.2 eV; one of (i) connecting the drain to a zero potential, and (ii) floating the drain; one of (i) connecting the source to a zero potential and (ii) floating the source; and connecting the substrate to a zero potential.

BRIEF DESCRIPTION OF DRAWINGS

These and further features of the present invention will be apparent with reference to the following description and drawings, wherein.

DISCLOSURE OF INVENTION

Figure 1:
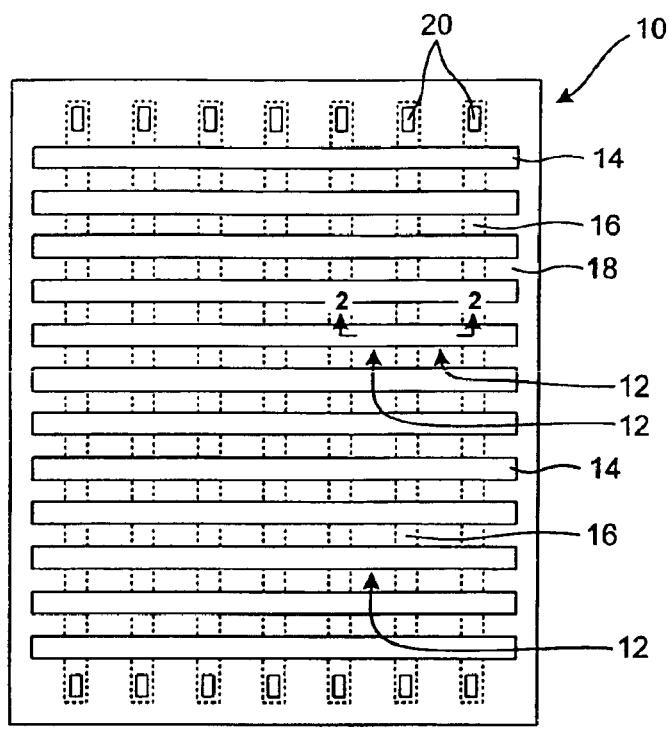
FIG. 1 is a schematic block diagram of a portion of a core memory array from a memory unit that can include a plurality of flash memory devices fabricated in accordance with the present invention.

In the detailed description that follows, similar components have been given the same reference numerals, regardless of whether they are shown in different embodiments of the present invention. To illustrate the present invention in a clear and concise manner, the drawings may not necessarily be to scale and certain features may be shown in somewhat schematic form.

With reference to FIG. 1, shown is a top view schematic block diagram of a portion, or sector, of a core memory array 10 from a memory unit that can include a plurality of core memory devices 12. In accordance with certain aspects of the invention and as discussed in greater detail below, the memory devices 12 can be implemented as dual cell, charge trapping dielectric memory devices. In addition, each memory device 12 can be considered a non-volatile, flash electrically erasable and programmable memory device 12.

The memory unit can also include a logic circuit (not shown) for use in controlling various operations (e.g., programming, reading and/or erasing) of the core memory array 10. The memory unit can also include external (or static) references (not shown) for using in generating various reference currents, such as an erase verify reference, a soft-program verify reference and a program verify reference. As one skilled in the art will appreciate, the core memory devices 12 can be used by a customer of the memory unit to store information, such as data or executable code.

The core memory array 10 can include a plurality of word lines 14 (also referred to as gate lines) and bit lines 16. The word lines 14 are disposed over and separated from the bit lines 16 by a dielectric stack 18 in a grid arrangement (e.g., the word lines 14 are disposed in a transverse direction to the bit lines 16). The word lines 44, the bit lines 16 and the dielectric stack 18 are operatively arranged to form the core memory devices 12. Although not described in great detail herein, some of the core memory devices 12 can be used as dynamic reference devices to assist in reading the remaining core memory devices 12 by tracking drift in threshold voltage of the core memory devices 12 over multiple program/erase (P/E) cycles and aging of the memory unit.

As will be discussed in greater detail below, application of appropriate voltages to the word lines 14 and the bit lines 16 allows for the addressing of the memory devices 12 of the sector such that each memory device 12 can be programmed, read, verified and/or erased. Bit line contacts 20 can be used to establish electrical connection to the bit lines 16 through the dielectric stack 18.

Figure 2:
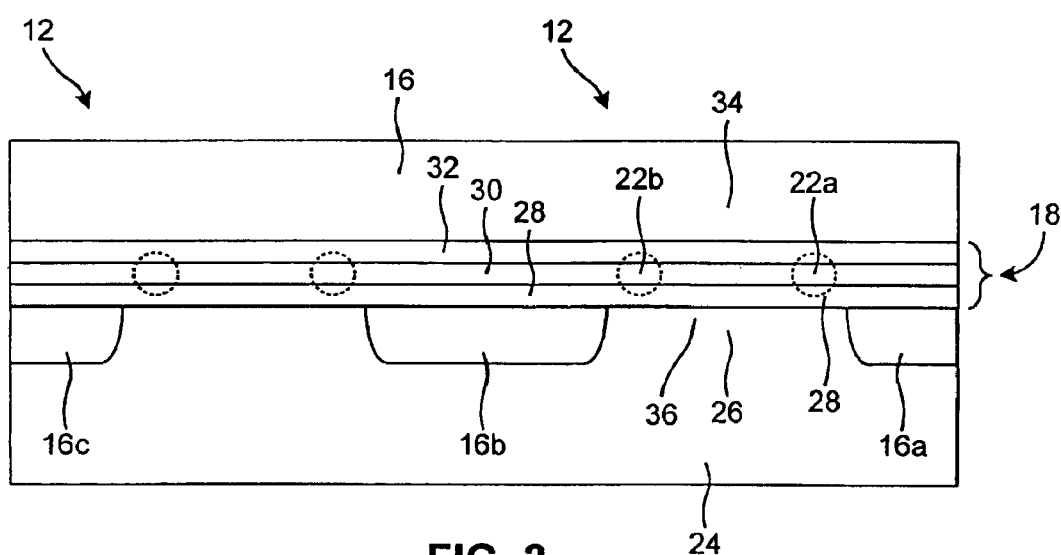
FIG. 2 is a schematic cross-section illustration of an exemplary memory device taken along the line 2—2 of FIG. 1.

With additional reference to FIG. 2, a portion of the core memory array 10 is illustrated in cross-section to illustrate an exemplary arrangement of the memory devices 12 of the core memory array 10. It should be understood that the illustrated memory devices 12 are shown for exemplary purposes and can be implemented with alternative structures (e.g., in stacked gate arrangement, in recessed gate arrangement, etc.). The exemplary memory devices 12 are implemented as a charge trapping dielectric type flash memory devices, each of which include a pair of complimentary charge trapping regions 22a, 22b that can be independently programmed and read.

In the illustrated embodiment, the core memory device 12 is fabricated on a semiconductor substrate 24 having P type conductivity. In one embodiment, the substrate 24 can be formed from silicon (Si). In other embodiments, the substrate can be formed from another suitable material, such as germanium (Ge) or silicon-germanium (SiGe). Within the substrate 24, the bit lines 16 are formed in a buried bit line format. The bit lines 16 (which function as conductive regions) can be formed by implanting N type dopant into the substrate 24, or from a metal or metal containing compound (e.g., silicide bit lines 16). In one embodiment, the bit lines 16 have N+ conductivity. Although not illustrated, a nitride layer can be formed at least partially over the bit lines 16 and P+ pocket implants can be added adjacent the bit lines 16.

For each core memory device 12, adjacent pair of bit lines 16 form conductive regions that function as a source and a drain during various programming and reading operations. For each device, a body 26 is disposed between the adjacent pairs of bit lines 16.

Above the substrate 24 is the dielectric stack 18. The dielectric stack 18 includes a bottom dielectric layer 28 (also referred to as a tunneling dielectric layer) that is made from, for example, silicon oxide (e.g., SiO$_2$) or other suitable material.

Over the bottom dielectric layer 28 is a charge trapping layer (also referred to as a charge storing layer 30). The charge storing layer 30 can be made from, for example, a non-conductive material including silicon nitride (Si$_3$N$_4$) or other suitable material.

Over the charge storing layer 30 is another dielectric layer (also referred to as a top dielectric layer 32) made from a material such as, for example, silicon oxide (e.g., SiO$_2$) or other suitable material. Alternative materials for the dielectric layers 28 and 32 can include high dielectric materials (e.g., dielectric materials having a relative permittivity greater than the relative permittivity of silicon oxide).

In one embodiment, the bottom dielectric layer 28 can have a conventional thickness of about 70 Å to about 100 Å. In another embodiment, the bottom dielectric layer 28 has a thickness that is less than the thickness of the top dielectric layer 32. For example, the bottom dielectric layer 26 can have a thickness of about 40 Å to about 60 Å, while the top dielectric layer can have a thickness between about 100 Å to about 120 Å. As is described more fully below, the thickness of the bottom dielectric layer facilitates effective FN (or channel) erasing, while remaining thick enough to prevent a low voltage leakage current and facilitate desirable data retention. In one embodiment, the charge storing layer 30 has a thickness of about 50 Å to about 70 Å. As is discussed more fully below, the thickness of the bottom dielectric layer 28, in combination with a word line 14 material having a work function greater than that of N+ polysilicon can result in significant advantages with respect to erasing of the charge storing regions 22a, 22b.

The word lines 14 are formed over the top dielectric layer 32. For each core memory device 12, one of the word lines 14 functions as a gate electrode 34 that, in part, controls a channel 36 interposed between the adjacent pairs bit lines 16. In alternative arrangements, the gate electrodes 34 can be formed from interconnected islands or pads. A work function of the word line 14 and the dielectric stack 18, in part, controls the channel 36 (e.g., inversion or depletion state) within the body 24.

As one skilled in the art will appreciate, modifications to the memory devices 12 described herein can be made. Such modifications can include changes to the physical arrangement of the memory devices 12 materials used, doping parameters and the like. However, the programming, verifying, reading and/or erasing techniques described herein can be used in conjunction with such a modified device.

The word lines 14 can be made from a material that has a work function that is greater than a work function of N+ polycrystalline silicon. N+ polysilicon can have a work function of about 4.1 eV to about 4.15 eV. In one embodiment, the work function of the word line 14 material is about 4.6 eV to about 5.2 eV. In another embodiment, the work function of the word line 14 material is about 4.6 eV to about 4.9 eV.

Materials that are particularly well suited for the word lines 14 include P+ polysilicon (having a work function of about 5.1 eV to about 5.2 eV), nickel silicide (NiSi) (having a work function of about 4.9 eV), tungsten (W) (having a work function of about 4.6 eV), cobalt silicide (CoSi) (having a work function of about 4.7 eV) and P+ silicon carbide (having a work function of about 6.65 eV to about 6.95 eV). Although P+ silicon carbide shows about 0.2 eV to about 0.5 eV lower electron barrier then P+ polysilicon, a much larger band gap compared to silicon (e.g., about 3 eV in P+ silicon carbide and about 1.1 eV in P+ polysilicon) could compensate for the lower electron barrier, thereby resulting in a much larger work function in P+ silicon carbide than in N+ poysilicon.

Word line 14 material comprising a silicide (e.g., NiSi and CoSi) can be made by, for example, depositing a layer of silicon (e.g., polysilicon), depositing a layer of appropriate metal on top of the layer of silicon and reacting the two layers as is known in the art. Word line 14 material comprising tungsten can be formed by sputtering, for example. Word line 14 material comprising P+ silicon carbide can be made by epitaxially depositing silicon carbide (e.g., a polytype, such as 6H, 3C, 2H, 4H or 15R) and implanting ions to achieve a desired dopant parameter (e.g., implanting boron, gallium or indium to a dopant concentration of about 9×10$^{18}$ atoms/cm$^3$ or greater). Thereafter, the word line 14 material can be patterned (e.g., by lithography and etching) to form the actual word liners 14.

Other materials can be used for the word lines 14 such that the word lines 14 have a work function greater than a work function of N+ polycrystalline silicon. For example, semiconductor materials can be used, such as silicon (Si) that has been implanted, in situ doped or reacted with any other appropriate material; germanium (Ge) (germanium, without doping, can have a work function of about 4.8 eV to about 5.0 eV); selenium (Se) (selenium, without doping, can have a work function of about 5.9 eV); tellurium (Te) (tellurium, without doping, can have a work function of about 4.95 eV) and so forth.

Metals could also be used, examples of which include, tantalum (Ta) (tantalum having a work function of about 4.0 eV to about 4.8 eV); aluminum (Al) (aluminum can have a work function of about 4.06 eV to about 4.41 eV); nickel (Ni) (nickel can have a work function of about 5.04 eV to about 5.35 eV); ruthenium (Ru) (ruthenium can have a work function of about 4.71 eV); rhodium (Rh) (rhodium can have a work function about 4.98 eV); palladium (Pd) (palladium can have a work function of about 5.12 eV to about 5.6 eV); platinum (Pt) (platinum can have a work function of about 5.65 eV to about 5.7 eV); gold (Au) (gold can have a work function or about 5.1 eV to about 5.47 eV); copper (Cu) (copper can have a work function of about 4.48 eV to about 4.94 eV); silver (Ag) (silver can have a work function of about 4.26 eV to about 4.74 eV); titanium (Ti) (titanium can have a work function of about 4.33); zinc (Zn) (zinc can have a work function of about 4.33 eV to about 4.9 eV); molybdenum (Mo) (molybdenum can have a work function of about 4.36 eV to about 4.95 eV); niobium (Nb) (niobium can have a work function of about 3.95 eV to about 4.87 eV); lead (Pb) (lead can have a work function of about 4.25 eV); tin (Sn) (tin can have a work function of about 4.42 eV); iridium (Ir) (iridium can have a work function of about 5.0 eV to about 5.76 eV); and so forth.

In yet another embodiment, a metal containing compound, an alloy and/or a suicide could be used. Example metal-containing materials include, for example, tantalum nitride and titanium nitride, etc.

In still another embodiment, the word lines 14 (or gate electrode pads) can be formed from multiple materials (including silicon) to form, for example, a multi-segment gate electrode 34. In this way, the work function of the gate electrode 34 can be varied and/or controlled, for example, along the length of the channel 36.

Figure 3:
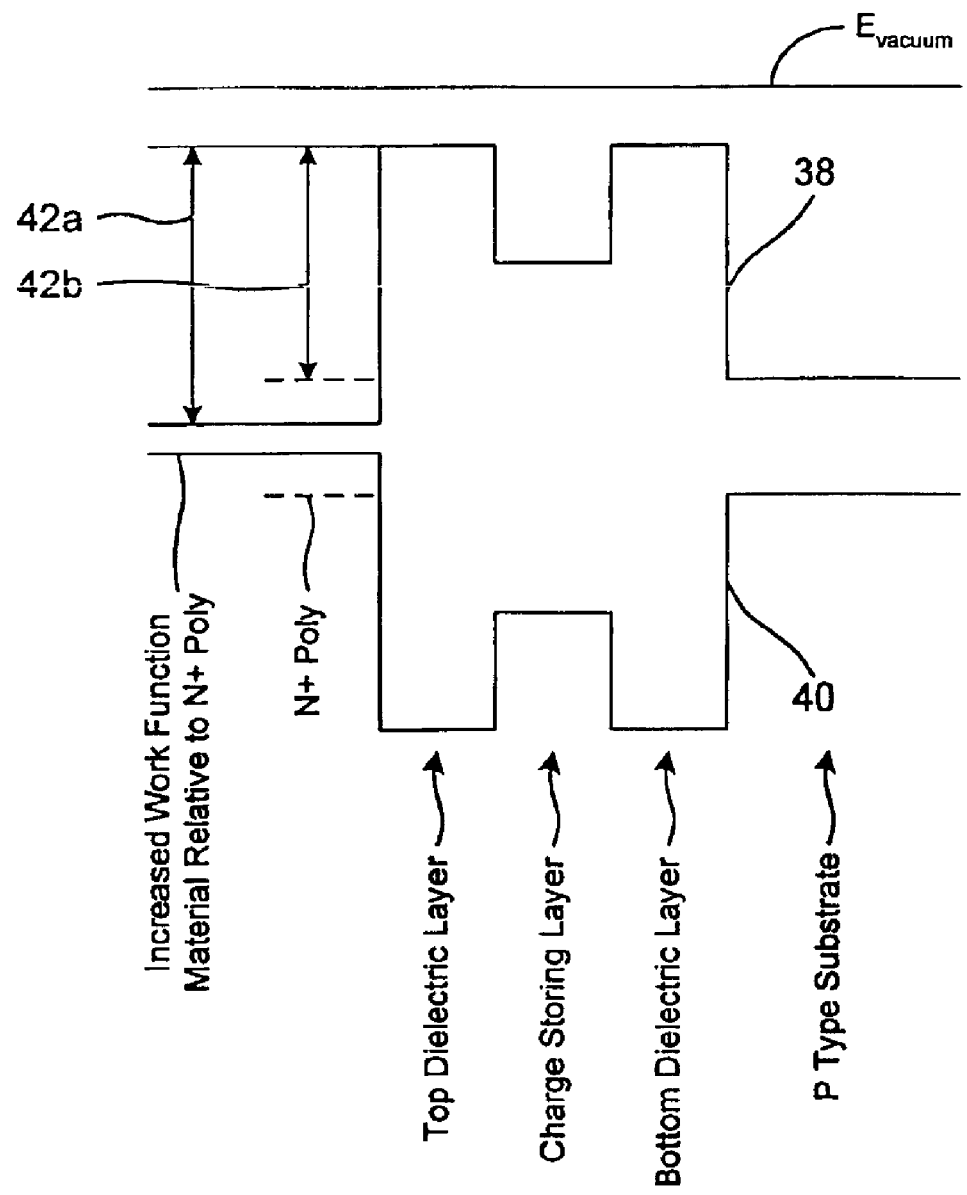
FIG. 3 is an energy band diagram for the memory device under flat band conditions with an energy barrier for a conventional N+ poly gate superimposed thereon.

With additional reference to FIG. 3, shown is an energy band diagram for the memory device 12 under flat band conditions (e.g., fermi levels are not included) with an energy barrier for a conventional N+ poly gate superimposed thereon (shown in dashed lines). The energy band diagram shows a conduction band 38 and a valence band 40 through the gate electrode 34 region, the top dielectric layer 32, the charge storing layer 30, the bottom dielectric layer 28 and the P type silicon substrate 24. A representative energy barrier 42a from the gate electrode 34 to the top dielectric layer 32 for a gate electrode 34 material having a work function (e.g., about 4.6 eV to about 5.2 eV) that is higher than a work function of N+ polysilicon is shown. Also shown is a representative energy barrier 42b for a conventional N+ polysilicon gate electrode.

Without intending to be bound by theory, increasing the work function of the word line 14 material over the conventionally used N+ polysilicon material will increase the energy barrier differential between the word line 14 material and the material of the top dielectric layer 32 and the tunnel dielectric layer 28. As will be shown in greater detail below with respect to an example P+ polysilicon gate electrode 34, the increased energy barrier 42a will allow for FN erase of the memory device 12, rather than band-to-band hot hole injection. FN erase will tend to cause less damage to the bottom dielectric layer 28 over repeated program/erase cycles by avoiding hole bombardment. According, the memory device 12 as a whole should retain charge better than convention charge trapping dielectric memory devices for improved data retention.

Referring back now to FIG. 2, each charge storing cell 22a, 22b can independently have two data states. The data states can represent binary values such as a logical zero and a logical one. The logical one, for example, can be implemented by leaving the desired charge storing cell 22 in an unprogrammed state or blank program level. The logical zero, for example, can be implemented by storing an amount of charge in the desired charge storing cell 22. This condition is also referred to as a charged state, a programmed state, a programmed level or a charged program level.

In the illustrated embodiment, the memory device 12 is a structurally symmetrical device allowing for programming, verifying and reading of the first charge storing cell 22a and the second charge storing cell 22b by respectively switching the roles of the bit lines 16a and 16b (source and drain) during those operations. Therefore, the bit lines 16a, 16b will be referred to interchangeably by the terms source and drain, depending on the charge storing cell 22 of interest.

For purposes of the present disclosure, the programming technique to store the charged program level with either of the charge storing cells 22 involves hot electron injection, also referred to as channel hot electron injection (CHE). However, it should be appreciated that modifications to the programming techniques can be made to accommodate variations in the specific memory device used.

Using hot electron injection, the first charge storing cell 22a can be programmed to the charged program level by applying a drain voltage potential (e.g., about four volts to about six volts) to the bit line 16a (functioning as the drain) and a gate voltage potential (e.g., about nine volts to about ten volts) to the word line 14 (functioning as the gate electrode 34). The other bit line 16b functions as the source (i.e., source of electrons) for the CHE programming of the charge storing cell 22a, and can be grounded or alternatively connected to a bias voltage potential.

The voltages applied to the gate electrode 34, the source and the drain generate a vertical electric field through the dielectric layers 28, 32 and the charge storing layer 30 and a lateral electric field along the length of the channel 36 from the source to the drain. At a given threshold voltage, the channel 36 will invert such that electrons are drawn off the source and begin accelerating toward the drain. As the electrons move along the length of the channel 36, the electrons gain energy and upon attaining enough energy, the electrons are able to jump over the potential barrier of the bottom dielectric layer 28 and into the charge storing layer 30 where the electrons become trapped. The probability of electrons jumping the potential barrier is a maximum in the area of the charge storing cell 22a adjacent the drain (i.e., bit line 16a), where the electrons have gained the most energy. These accelerated electrons are termed hot electrons and once injected into the charge storing layer 30, tend to stay in the charge storing cell 38 of the charge storing layer 30. The trapped electrons tend not to spread through the charge storing layer 30 due to this layer's low conductivity and low lateral electric field therein. Thus, the trapped charge remains localized in the charge trapping region of the charge storing cell 22a close to the adjacent bit line 16a.

The foregoing technique to program the first charge storing cell 22b can be used to program the second charge storing cell 22b, but the functions of the bit lines 16a and 16b (i.e., source and drain) are reversed.

Reading of the charge storing cells 22 of the memory device 12 can be carried using, for example, a reverse read operation. For example, to read the first charge storing cell 22a, a voltage potential can be applied to the conductive region opposite the first charge storing region 22a (i.e., bit line 16b, which is also referred to as the drain during read operations) and a voltage potential can be applied to the word line 14 (function as the gate electrode 34). The conductive region adjacent the first charge storing region 22a (i.e., bit line 16a, which is also referred to as the source during read operations) can be grounded. To read the second charge storing cell 22b, the roles of the conductive regions can be reversed. The read operation drain voltage functions to mask, or "cover up," charge stored by the "unread" charge storing cell 22. During the read operation of the memory device 12 an amount of current drawn across the channel 36 can be compared against a reference current to determine the data state of the "read" one of the charge storing cells 22.

As indicated, erasing the charge storing region 22 can be accomplished by using an FN erase operation. As is described more fully below, this channel erase operation is possible because of the structural features of the memory device 12. For example, the use of a relatively high work function gate electrode 34 sufficiently eliminates back tunneling from the gate electrode 34, across the top dielectric layer 32, into the charge storing layer 30. In addition, the embodiment having a reduced thickness bottom dielectric layer 28 facilitates weak direct tunneling across the bottom dielectric layer 28, while still preserving data retention capability.

In one embodiment, both charge storing cells are erased simultaneously by applying a negative gate erase voltage to the gate electrode 34 and grounding the source and drain (bit lines 16), and substrate 24. In one embodiment, a relatively large negative gate erase voltage (e.g., about −20 volts) is applied to the gate electrode 34. Alternatively, smaller negative gate erase voltages (e.g., between about −4 volts to about −10 volts) may be applied. In another embodiment, the gate voltage is about −15 volts to about −20 volts, while the source and drain are floated or grounded and the substrate is grounded. Alternatively, in an embodiment in which the memory device sits in an isolated P-well within the substrate, a negative gate erase voltage of about −5 volts to about −10 volts is applied in conjunction with a positive P-well voltage of about +5 volts to about +10 volts with the source and drain left to float.

Figure 4:
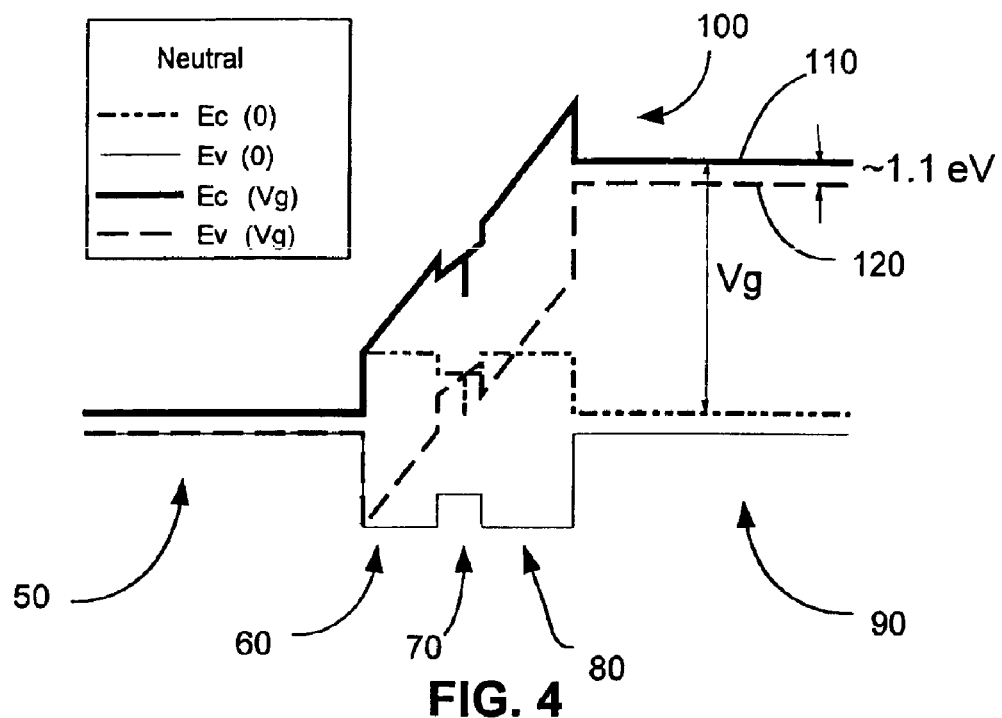
FIG. 4 is a neutral state energy band diagram of a charge trapping dielectric memory device having a P+ gate in accordance with one embodiment of the present invention.
Figure 5:
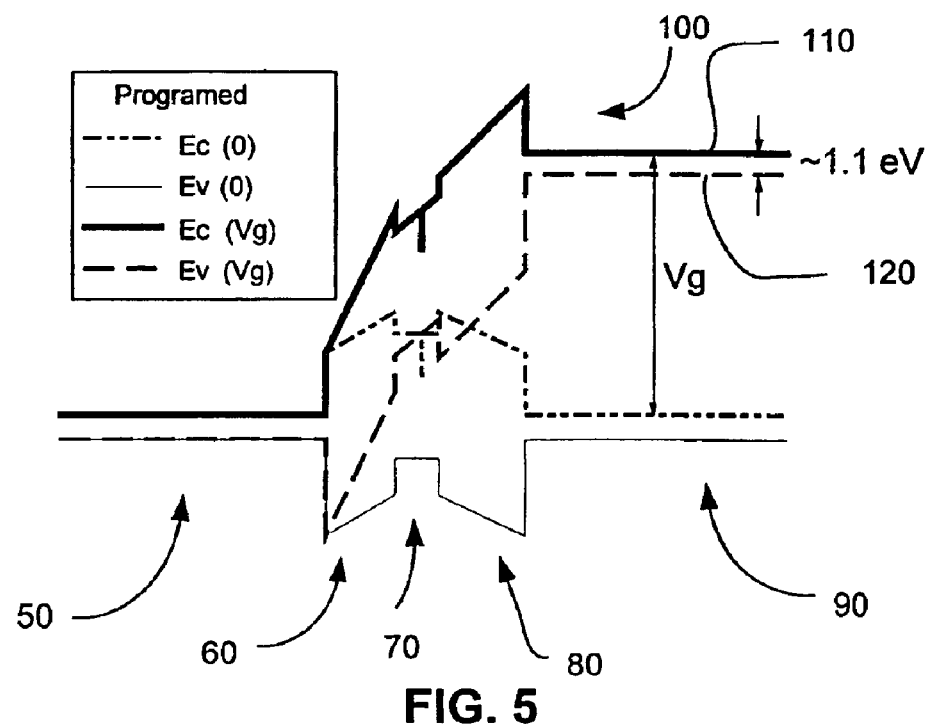
FIG. 5 is a programmed state energy band diagram of a charge trapping dielectric memory device having a P+ gate in accordance with one embodiment of the present invention.
Figure 6:
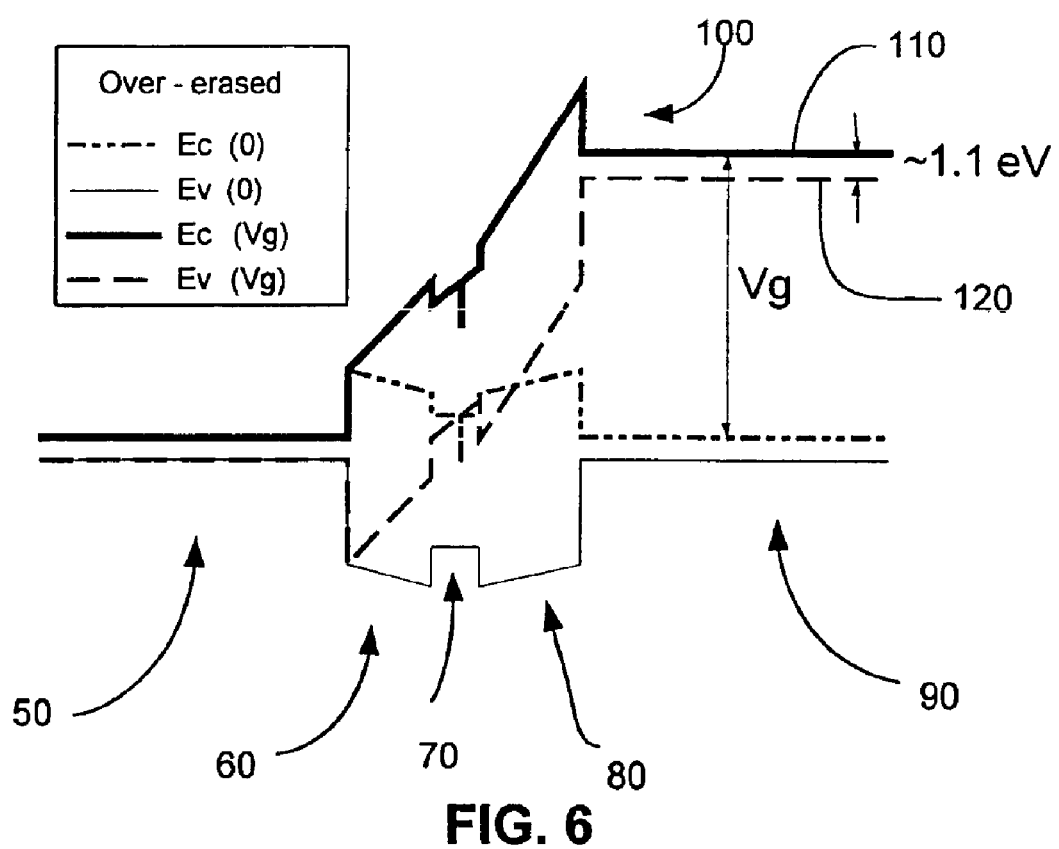
FIG. 6 is an over-erased state energy band diagram of a charge trapping dielectric memory device having a P+ gate in accordance with one embodiment of the present invention.

FIGS. 4–6 represent energy band diagrams of neutral, programmed, and over-erased states, respectively, for a memory device having an exemplary P+ polysilicon gate electrode and a "thicker" (e.g., about 70 Å) silicon dioxide bottom dielectric layer in accordance with one embodiment of the invention. Regions 50, 60, 70, 80, and 90 represent the substrate, bottom dielectric layer, charge storing layer, top dielectric layer, and gate electrode layer, respectively. The use of a P+ gate electrode provides an increased barrier height (shown by triangular barrier 100), which prevents charge, in the form of electrons, from overcoming the barrier potential of the top dielectric layer 80 and tunneling into the charge storing layer during erase operations. It is to be appreciated that "barrier height," as used herein, refers to the size of the energy bandgap between the valence band and conduction band for a given material. This increased barrier height sufficiently minimizes, if not effectively prevents or otherwise "shuts off," back tunneling of electrons from the gate electrode, through the top dielectric layer, into the charge storing layer during a channel or FN erase operation.

In particular, with reference to FIG. 4, the energy level of the conduction band (Ec) 110 is approximately 1.1 eV (electron-volts) greater than the energy level of the valence band (Ev) 120 within the polysilicon gate electrode region 90. A conventional gate electrode having an N+ dopant concentration is characterized by a fermi level, which is very close to the conduction band 110. For a memory device having an N+ gate electrode, the size of the triangular barrier 100 is approximately 3.1 eV. In contrast, the gate electrode of the present invention has a P+ dopant concentration, which is characterized by a fermi level just above the valence band 120. Therefore, for a memory device having a P+ gate electrode, the size of the triangular barrier 100 is approximately 4.2 eV. While the approximately 1.1 eV difference in the height of the triangular barrier 100 for a P+ gate electrode is significant, the effect on back tunneling current from the gate electrode to the charge storing layer is exceptional in light of the fact that the tunneling rate decreases exponentially with increasing barrier height. The increased barrier height, in turn, allows for a relatively large negative gate voltage of approximately −20 volts to be applied across the ONO stack to facilitate an FN channel erase operation in which both the normal bit and the complementary bit are effectively erased without encountering any back tunneling through the top dielectric layer.

Figure 7:
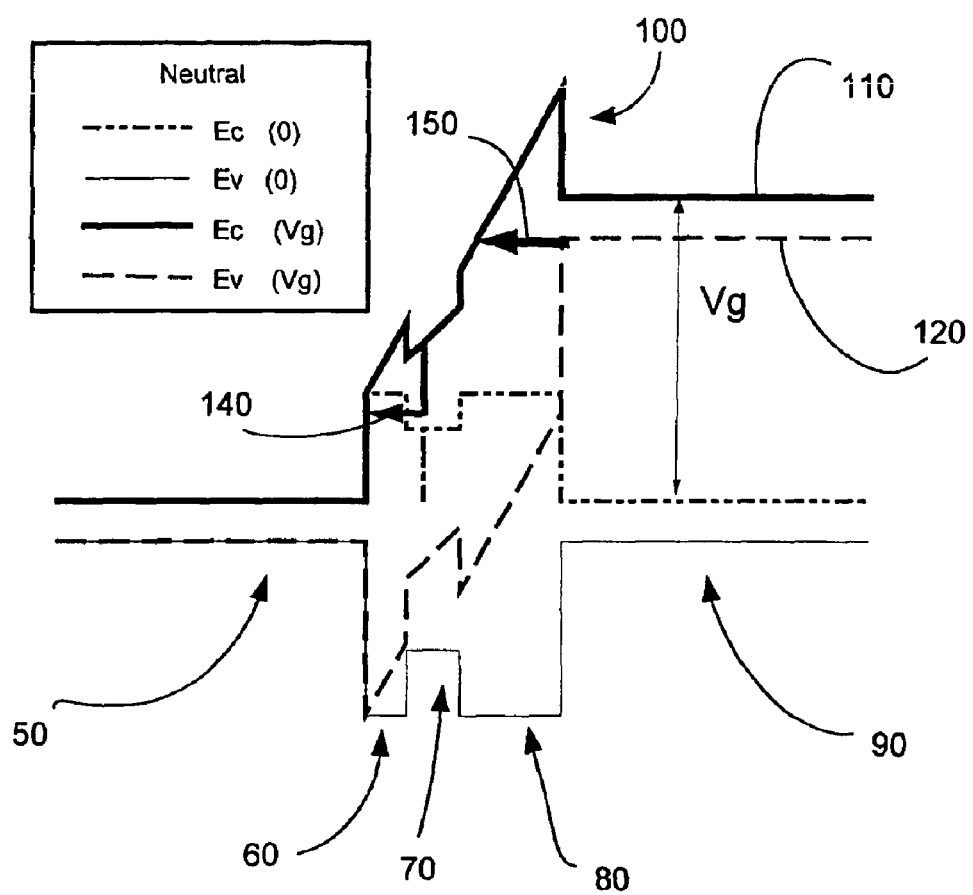
FIG. 7 is a neutral state energy band diagram of a charge trapping dielectric memory device having a P+ gate and a reduced thickness bottom oxide in accordance with another embodiment of the present invention.
Figure 8:
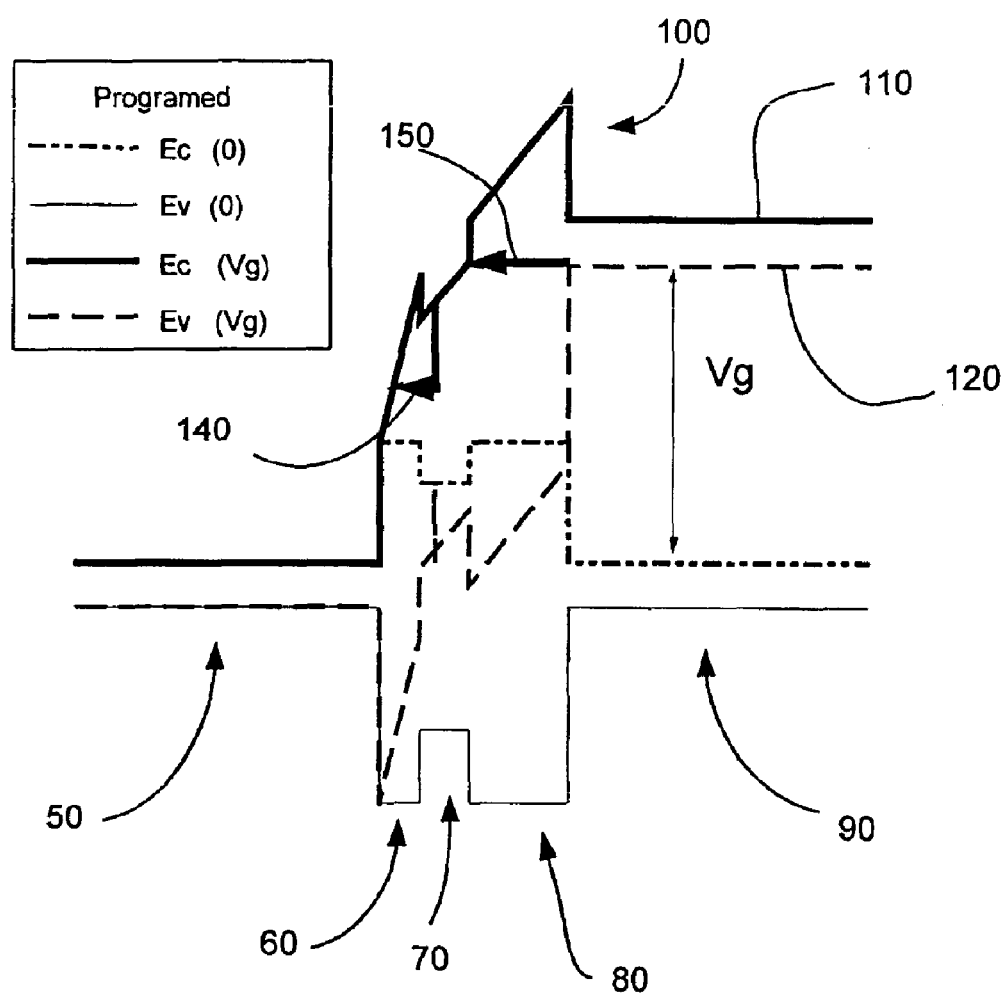
FIG. 8 is a programmed state energy band diagram of a charge trapping dielectric memory device having a P+ gate and a reduced thickness bottom oxide in accordance with another embodiment of the present invention.

FIGS. 7 and 8 represent energy band diagrams of neutral and programmed states, respectively, for a memory device having a P+ gate electrode and a thinner bottom dielectric layer (e.g., between about 40 Å to about 60 Å) in accordance with another embodiment of the invention. Again, regions 50, 60, 70, 80, and 90 represent the substrate, reduced thickness bottom dielectric layer, charge storing layer, top dielectric layer, and gate electrode layer, respectively. As discussed above, the P+ gate electrode provides an increased barrier height (shown by triangular barrier 100), which effectively prevents back tunneling of electrons from the gate electrode, through the top dielectric layer, into the charge storing layer during a channel erase operation. In addition, the reduced thickness bottom layer is effective to increase the probability that during an erase operation, electrons within the charge storing layer will overcome a potential barrier of the bottom dielectric to exit the charge storing layer. In other words, the reduced thickness bottom dielectric layer provides a reduced barrier width, which, in turn, facilitates direct tunneling (represented by arrow 140) from the charge storing layer during a channel erase operation. Therefore, it is to be appreciated that the channel erase mechanism is a combination of FN tunneling (represented by arrow 150) and weak direct tunneling. In addition, the channel erase operation is effective to remove charge from the entire channel without the need for a tailored erase operation.

Figure 9:
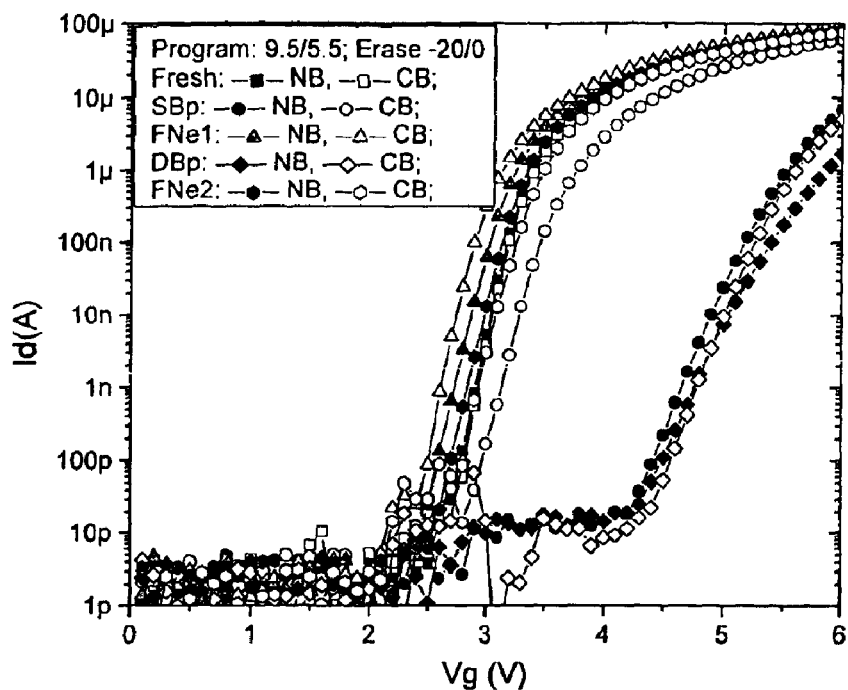
FIG. 9 is a plot of drain current vs. gate voltage for a plurality of channel erase operations performed on a charge trapping dielectric memory device in accordance with the present invention.

FIG. 9 is a plot of the logarithm of drain current, Id(A), vs. gate voltage, Vg(V), on an exemplary device having a P+ gate electrode for a plurality of program and erase operations, such as single-bit programming (SBp), double-bit programming (DBp), and FN erasing (FNe1, FNe2). Artisans will appreciate that the normal bit is represented by (NB), while the complementary bit is represented by (CB). In this embodiment, a gate program voltage of approximately 9.5 volts is used together with a voltage of approximately 5 volts applied to the drain. In addition, a negative gate erase voltage of approximately −20 volts is used, while the source, drain, and substrate are held at 0 volts.

Figure 10:
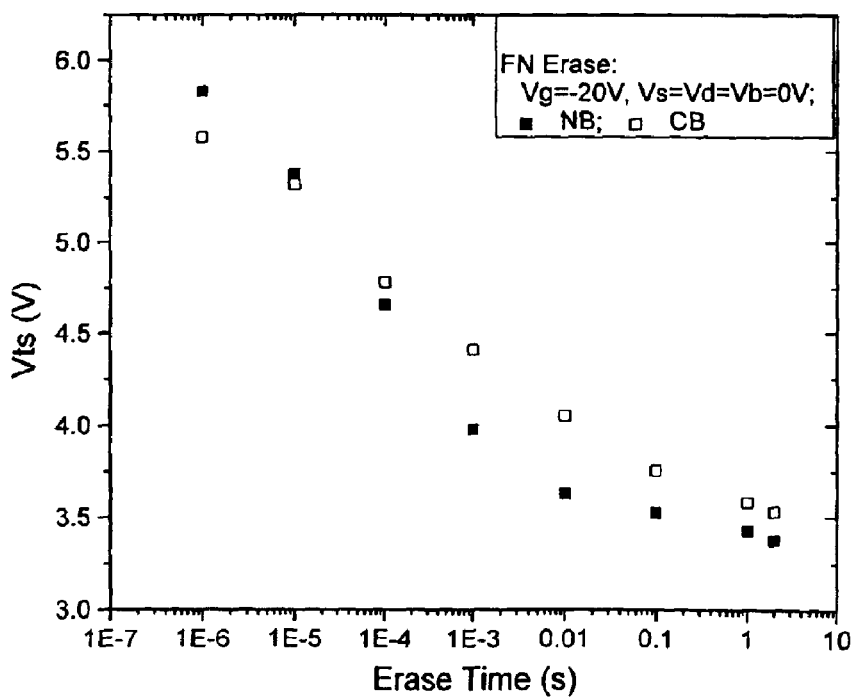
FIG. 10 is a plot of threshold voltage vs. erase time for both a normal bit and a complementary bit on a charge trapping dielectric memory device in accordance with the present invention.

FIG. 10 is a plot of threshold voltage (Vt) vs. erase time (on log scale) for both the normal bit (NB) and complementary bit (CB) when a negative gate erase voltage is used. In this embodiment, the gate voltage Vg is approximately −20 volts, while the source, drain, and substrate are held at 0 volts. As shown in FIG. 10, it is possible to erase both bits with an erase pulse of approximately 100 ms (milliseconds), resulting in both cells being erased in approximately 1 second.

Additional discussion of the memory device 12 having a P+ polysilicon gate electrode 34 is contained in U.S. patent application Ser. No. 10/341,881, filed Jan. 14, 2003, the disclosure of which is herein incorporated by reference in its entirety. As should be apparent, similar results can be achieved using other gate electrode materials, including nickel silicide, tungsten, cobalt silicide and P+ silicon carbide.

It is to be appreciated that the memory device of the present invention is efficient in erase operation and reliable in data retention up to at least 10,000 (10K) program-erase cycles.

In addition, the enhanced data retention ability of the memory device 12 can assist in the implementation of multi-level charge storage to accomplish the storage of multiple discernable charge amounts in each charge storing region 22a, 22b. The ability to store multiple discernable charge amounts allows for the implementation of single-bit multi-level cell (MLC) data storage and quad bit MLC data storage. In these embodiments, device threshold voltages corresponding to each charge storage level can be relatively close together (e.g., separated by about one volt per level). If the device was prone to charge loss, higher program level threshold voltage distributions could begin to overlap with lower program level threshold voltage distributions, especially in the presence of complimentary bit disturb during read operations, and inaccurate read operation outputs could result. However, the memory device 12 described herein, which is erasable by an FN erase operation that causes less tunnel dielectric layer damage than BTB hot hole erase operations, can operate accurately and reliably in MLC embodiments.

In the single-bit MLC embodiment, each charge storing region 22a, 22b can have multiple data states, such as four data states. However, each charge storing region 22a, 22b is programmed to stored the same data state. To determine the data state stored by each charge storing region 22a, 22b, only one of the charge storing region 22a, 22b needs to be read. Therefore, in the single-bit MLC embodiment, each memory device 12 (or "transistor") has four data states (i.e., the four data states associated with the read charge storing region 22a, 22b). In another embodiment there can be more than three charged program levels.

In the quad-bit embodiment, each charge storing region 22a, 22b can independently have multiple data states, such as four data states. That is, each charge storing region 22a, 22b can be programmed to any of the multiple data states to take advantage of the asymmetrical date storage capability of the memory device 12. To determine the data state stored by each charge storing region 22a, 22b, each of the charge storing region 22a, 22b can be read in separate read operations. Therefore, in the quad-bit embodiment, each memory device 12 (or "transistor") has sixteen data states (i.e., between the associated pair of charge storing region 22a, 22b, there are sixteen permutations of the blank program level and the three charged program levels). In another embodiment there can be more than three charged program levels.

Additional discussion of MLC programming of the memory device, including single-bit MLC and quad bit MLC programming can be found in U.S. patent application Ser. No. 10/413,800, filed Apr. 15, 2003 and in U.S. patent application Ser. No. 10/422,092, filed Apr. 24, 2003, the disclosures of which are herein incorporated by reference in their entireties.

Although particular embodiments of the invention have been described in detail, it is understood that the invention is not limited correspondingly in scope, but includes all changes, modifications and equivalents coming within the spirit and terms of the claims appended hereto. For example, adjustment to the program, read and erase pulse voltage potentials can be made.

What is claimed is:

1. A charge trapping dielectric memory device, comprising:
    a substrate having a first conductive region and a second conductive region formed therein and a channel region interposed between the first and the second conductive regions;
    a first dielectric layer disposed over the substrate;
    a dielectric charge trapping layer disposed over the first dielectric layer;
    a second dielectric layer disposed over the charge trapping layer; and
    a gate electrode disposed over the second dielectric layer, wherein the gate electrode has a work function of about 4.6 eV to about 5.2 eV.

2. The memory device according to claim 1, wherein the gate electrode has a work function of about 4.6 eV to about 4.9 eV.

3. The memory device according to claim 1, wherein the gate electrode is implemented as a word line.

4. The memory device according to claim 1, wherein the first and second conductive regions are implemented as buried bit lines.

5. The memory device according to claim 1, wherein the gate electrode is made from nickel silicide (NiSi).

6. The memory device according to claim 1, wherein the gate electrode is made from tungsten (W).

7. The memory device according to claim 1, wherein the gate electrode is made from cobalt silicide (CoSi).

8. The memory device according to claim 1, wherein the thickness of the first dielectric layer is less than the thickness of the second dielectric layer.

9. The memory device according to claim 8, wherein the first dielectric layer has a thickness of about 40 Å to about 60 Å.

10. The memory device according to claim 9, wherein the second dielectric layer has a thickness of about 100 Å to about 120 Å.

11. The memory device according to claim 8, wherein the first dielectric layer is effective to (i) increase the probability that, during an erase operation, electrons within the charge trapping layer will overcome a potential barrier of the first dielectric layer to exit the charge trapping layer into the substrate, and (ii) decrease the probability that, during operations other than an erase operation, electrons will overcome a potential barrier of the first dielectric layer and escape from the charge trapping layer.

12. The memory device according to claim 8, wherein the work function of the gate electrode and the first dielectric layer are effective to increase the probability that electrons will be removed from the charge trapping layer via a channel erase operation.

13. The memory device according to claim 1, wherein the work function of the gate electrode is effective to decrease the probability that, during an erase operation, electrons within the gate electrode will overcome a potential barrier of the second dielectric layer and enter the charge trapping layer.

14. The memory device according to claim 1, wherein the charge trapping layer is effective to store distinct charge amounts in each of a first and a second charge trapping region, the each distinct charge amount selected from a plurality of charge levels.

15. A method of performing an erase operation on a non-volatile, charge trapping dielectric memory device having a source and a drain within a substrate, a first dielectric layer disposed over the substrate, a dielectric charge trapping layer disposed over the first dielectric layer, a second dielectric layer disposed over the charge trapping layer, and a gate electrode disposed over the second dielectric layer to define a channel between the source and the drain, the memory device having been programmed by trapping charge in at least one charge trapping region of the dielectric charge trapping layer, the method comprising the simultaneous steps of:
    applying a negative erase voltage to a gate electrode, the gate electrode having a work function of about 4.6 eV to about 5.2 eV;
    one of (i) connecting the source and the drain to a zero potential, or (ii) floating the source and the drain; and
    connecting the substrate to a zero potential.

16. The method according to claim 15, wherein the erase voltage applied to the gate is in a range of about −10 volts to about −20 volts.

17. The method according to claim 15, wherein the charge trapping layer includes two charge trapping regions and both regions are erased simultaneously.

18. The method according to claim 15, wherein the gate electrode has a work function of about 4.6 eV to about 4.9 eV.

19. The method according to claim 15, wherein the stored charge is selected from one of a plurality of charge levels.

20. A charge trapping dielectric memory device, comprising:
    a substrate having a first conductive region and a second conductive region formed therein and a channel region interposed between the first and the second conductive regions;

a first dielectric layer disposed over the substrate;

a dielectric charge trapping layer disposed over the first dielectric layer;

a second dielectric layer disposed over the charge trapping layer; and a gate electrode disposed over the second dielectric layer, wherein the gate electrode is made from P+ silicon carbide (SiC).

21. The memory device according to claim 20, wherein the gate electrode is implemented as a word line.

22. The memory device according to claim 20, wherein the first and second conductive regions are implemented as buried bit lines.

23. The memory device according to claim 20, wherein the thickness of the first dielectric layer is less than the thickness of the second dielectric layer.

24. The memory device according to claim 23, wherein the first dielectric layer has a thickness of about 40 Å to about 60 Å.

25. The memory device according to claim 24, wherein the second dielectric layer has a thickness of about 100 Å to about 120 Å.

26. The memory device according to claim 23, wherein the first dielectric layer is effective to (i) increase the probability that, during an erase operation, electrons within the charge trapping layer will overcome a potential barrier of the first dielectric layer to exit the charge trapping layer into the substrate, and (ii) decrease the probability that, during operations other than an erase operation, electrons will overcome a potential barrier of the first dielectric layer and escape from the charge trapping layer.

27. The memory device according to claim 23, wherein the work function of the gate electrode and the first dielectric layer are effective to increase the probability that electrons will be removed from the charge trapping layer via a channel erase operation.

28. The memory device according to claim 20, wherein the work function of the gate electrode is effective to decrease the probability that, during an erase operation, electrons within the gate electrode will overcome a potential barrier of the second dielectric layer and enter the charge trapping layer.

29. The memory device according to claim 1, wherein the charge trapping layer is effective to store distinct charge amounts in each of a first and a second charge trapping region, the each distinct charge amount selected from a plurality of charge levels.

* * * * *

UNITED STATES PATENT AND TRADEMARK OFFICE
CERTIFICATE OF CORRECTION

PATENT NO. : 6,912,163 B2
DATED : June 28, 2005
INVENTOR(S) : Wei Zheng et al.

It is certified that error appears in the above-identified patent and that said Letters Patent is hereby corrected as shown below:

<u>Column 6,</u>
Line 57, replace "suicide" with -- silicide --.

Signed and Sealed this

Sixth Day of September, 2005

JON W. DUDAS
*Director of the United States Patent and Trademark Office*